(12) United States Patent
Ito et al.

(10) Patent No.: US 7,307,286 B2
(45) Date of Patent: Dec. 11, 2007

(54) EPOXY RESIN COMPOSITION FOR ENCAPSULATING OPTICAL SEMICONDUCTOR ELEMENT AND OPTICAL SEMICONDUCTOR DEVICE USING THE SAME

(75) Inventors: Hisataka Ito, Ibaraki (JP); Shinya Ota, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 40 days.

(21) Appl. No.: 10/964,733

(22) Filed: Oct. 15, 2004

(65) Prior Publication Data

US 2005/0082691 A1    Apr. 21, 2005

(30) Foreign Application Priority Data

Oct. 16, 2003   (JP)   ............ P. 2003-356788
Apr. 13, 2004   (JP)   ............ P. 2004-118243

(51) Int. Cl.
     *H01L 31/203*   (2006.01)
(52) U.S. Cl. .............. 257/98; 257/79; 257/100; 257/789; 257/794; 257/E33.059; 252/582
(58) Field of Classification Search .............. 257/98
     See application file for complete search history.

(56) References Cited

U.S. PATENT DOCUMENTS

| | | | | |
|---|---|---|---|---|
| 4,376,174 A | * | 3/1983 | Itoh et al. | 523/456 |
| 5,641,997 A | * | 6/1997 | Ohta et al. | 257/788 |
| 5,777,433 A | * | 7/1998 | Lester et al. | 313/512 |
| 6,107,364 A | * | 8/2000 | Fong et al. | 522/182 |
| 6,791,259 B1 | * | 9/2004 | Stokes et al. | 313/503 |
| 6,838,816 B2 | * | 1/2005 | Su et al. | 313/499 |
| 6,870,311 B2 | * | 3/2005 | Mueller et al. | 313/491 |
| 2002/0085601 A1 | * | 7/2002 | Wang et al. | 372/43 |
| 2003/0080341 A1 | * | 5/2003 | Sakano et al. | 257/79 |
| 2004/0147029 A1 | * | 7/2004 | Adam | 436/8 |

FOREIGN PATENT DOCUMENTS

| | | |
|---|---|---|
| EP | 1 236 765 A1 | 9/2002 |
| EP | 1 457 509 A1 | 9/2004 |
| JP | 11-74424 A | 3/1999 |
| JP | 2001-261933 A | 9/2001 |
| WO | WO 00/69976 A1 | 11/2000 |

OTHER PUBLICATIONS

XP-002354552 (2000), Derwent Publication—Abstract.
European Search Report dated Dec. 8, 2005.

* cited by examiner

*Primary Examiner*—Evan Pert
*Assistant Examiner*—Eduardo A. Rodela
(74) *Attorney, Agent, or Firm*—Sughrue Mion, PLLC

(57) ABSTRACT

An epoxy resin composition for encapsulating an optical semiconductor element, which has small internal stress and also can obtain good light transmittance within a broad temperature range. An epoxy resin composition for encapsulating an optical semiconductor element comprising the following component (A):

(A) an epoxy resin complex which comprises an epoxy resin as the matrix component and silicon dioxide particles (a) dispersed therein:

(a) silicon dioxide particles having an average particle size of from 5 to 40 nm measured by the small angle neutron scattering (SANS).

9 Claims, 1 Drawing Sheet

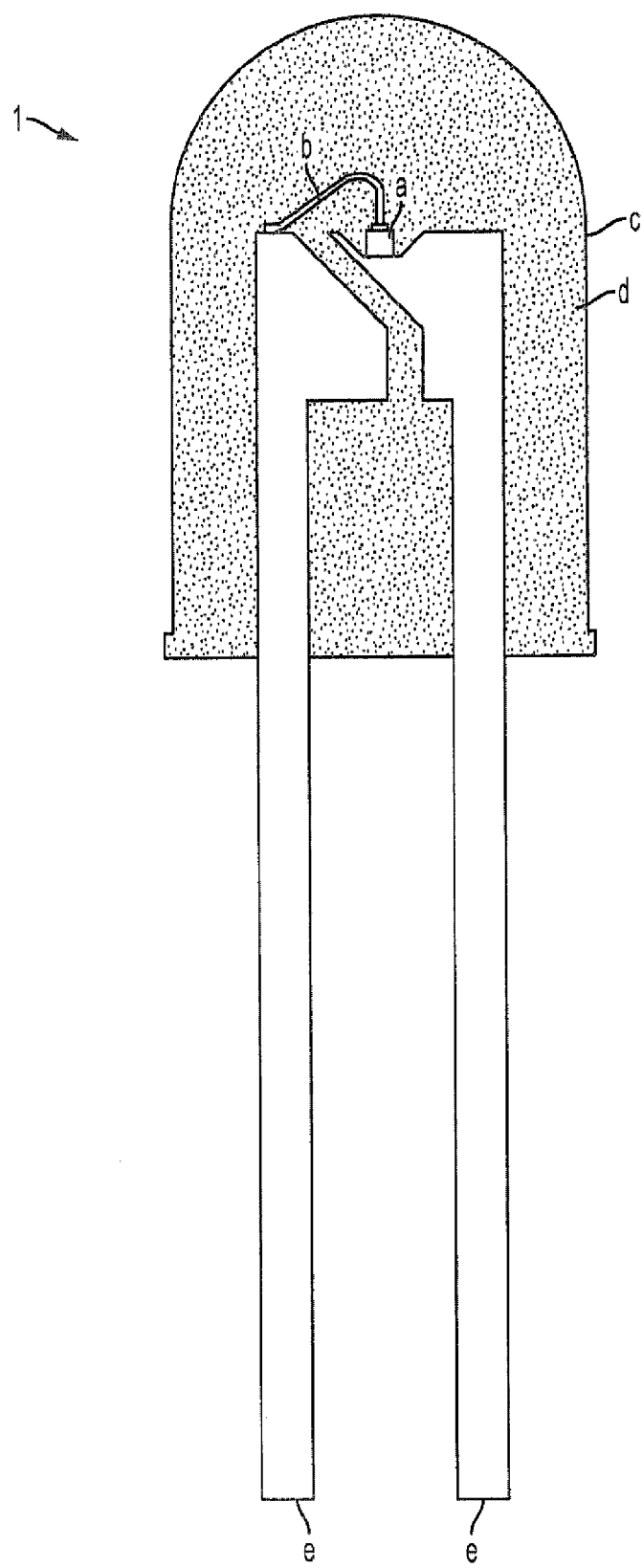
FIGURE

EPOXY RESIN COMPOSITION FOR ENCAPSULATING OPTICAL SEMICONDUCTOR ELEMENT AND OPTICAL SEMICONDUCTOR DEVICE USING THE SAME

FIELD OF THE INVENTION

This invention relates to an epoxy resin composition for encapsulating an optical semiconductor element, which is excellent in both light transmittance and low stress and an optical semiconductor device sealed with the same.

BACKGROUND OF THE INVENTION

Regarding a resin composition for encapsulation, which is used in encapsulation of optical semiconductor elements such as light emitting diode (LED) and the like, its cured product is required to have transparence. Therefore, in general, epoxy resin compositions obtained using a bisphenol A type epoxy resin, an alicyclic epoxy resin and the like epoxy resins and an acid anhydride as the curing agent are used widely for various purposes.

However, when the aforementioned epoxy resin composition is used as an encapsulating resin, internal stress is generated caused by the curing shrinkage at the time of the curing of the epoxy resin composition or by the distortion due to a difference in coefficient of linear expansion between the epoxy resin and the optical semiconductor element. As a result, the optical semiconductor element is deteriorated to cause a problem of, for example, when the optical semiconductor element is an emission element, reducing its brightness. Accordingly, as a method for reducing the aforementioned internal stress, a method has been proposed and partly realized, in which coefficient of linear expansion of an epoxy resin composition is approximated to that of an optical semiconductor element by adding inorganic powder having small coefficient of linear expansion such as silica powder or the like (e.g., see Reference 1).

However, the aforementioned method for approximating to that of an optical semiconductor element has a fatal disadvantage as an epoxy resin composition for encapsulating an optical semiconductor element, namely considerable reduction of light transmittance of the epoxy resin composition cured product. Thus, with the aim of solving the aforementioned disadvantage, for example, a method for reducing a difference in the index of refraction between a cured product comprising a resin component and glass powder as the inorganic powder has been proposed (cf. Reference 2).

However, even in a general case in which refraction index of a resin component is fitted to the average refraction index of transparent inorganic particles obtained by an immersion method or the like, the transparent inorganic particles have a distribution in the particle system by the aforementioned method, so that refraction index distribution among different particles cannot be disregarded and the light transmittance of the cured and formed product cannot be increased sufficiently because, when microscopically observed, a difference in the refraction index between the resin and transparent inorganic particles remains. In addition, even in case that the improvement of transmittance is attempted based on the average particle size, specific surface area is increased and reflection of light on the surface is increased when the average particle size is reduced, and when the average particle size is increased on the contrary, it is highly possible to cause a change in the internal refraction index distribution of each particle or to generate defects such as voids inside of the sealed and cured product, and these-cannot be disregarded and result in the reduction of light transmittance.

Reference 1: JP-A-11-74424
Reference 2: JP-A-2001-261933

SUMMARY OF THE INVENTION

Thus, the conventional compositions cannot be said sufficient as a resin composition for encapsulating high performance optical semiconductor elements such as high brightness LED and the like, so that an epoxy resin composition for encapsulating an optical semiconductor element having more high light transmittance and excellent low stress property is in demand.

Also, in the aforementioned composite system of transparent inorganic particles and a resin, the index of refraction of the resin component has different temperature dependency from that of the index of refraction of a filler as the transparent inorganic particles, so that even when the indexes of refraction of both cases are coincided, a difference in index of refraction occurs between the resin component and filler when exposed to a high temperature or a low temperature, thus resulting in the reduction of light transmittance.

In addition, in the case of an epoxy resin cured product prepared by dispersing silicon dioxide particles having a nano-order particle size in an epoxy resin, it is possible to reduce internal stress through the reduction of difference in coefficient of linear expansion from an optical semiconductor element or lead frame by decreasing its coefficient of linear expansion while keeping a high transmittance, but this has a disadvantage in that an amount of silicon dioxide particles sufficient for obtaining the effects of high transmittance and low coefficient of linear expansion cannot be formulated because viscosity of the resin composition for encapsulation becomes large.

The present invention has been made by taking such circumstances into consideration, and an object is to provide an epoxy resin composition for encapsulating an optical semiconductor element which has small internal stress and can obtain good light transmittance within broad temperature range, and an optical semiconductor device using the same.

That is, the present inventors have conducted intensive studies for the purpose of obtaining a material for encapsulating an optical semiconductor element which has high light transmittance even within a broad temperature range together with an internal stress reducing effect. As a result, it was found that, when an epoxy resin complex in which an epoxy resin is used as the matrix component, and silicon dioxide particles having a markedly small average particle size of from 5 to 40 nm measured by the small angle neutron scattering (SANS) are dispersed therein, is used, good light transmittance can be obtained within a broad temperature range because its temperature-dependency can be disregarded, and reduction of internal stress can be realized because it becomes possible to approximate coefficient of linear expansion to that of the optical semiconductor element.

In addition, it was found that, when an epoxy resin complex in which an epoxy resin is used as the matrix component, and silicon dioxide particles having a markedly small average particle size of from 5 to 40 nm measured by the small angle neutron scattering (SANS) are dispersed therein, is used, and a glass powder capable of optionally adjusting index of refraction is used as the filling material and thereby setting the difference between the index of refraction of a cured product of components excluding the aforementioned glass powder and the index of refraction of the glass powder to a specified range, good light transmittance can be obtained and reduction of internal stress can be realized because it becomes possible to approximate coefficient of linear expansion to that of the optical semiconductor element.

Based on these findings, the present invention was accomplished. That is, the present invention includes the following embodiments.

1. An epoxy resin composition for encapsulating an optical semiconductor element, comprising a component (A):

(A) an epoxy resin complex which comprises an epoxy resin as the matrix component and silicon dioxide particles (a) dispersed therein:

(a) silicon dioxide particles having an average particle size of from 5 to 40 nm measured by the small angle neutron scattering (SANS).

2. The epoxy resin composition for encapsulating an optical semiconductor element according to 1. above, wherein containing ratio of the silicon dioxide particles (a) in the component (A) is within the range of from 5 to 50% by weight based on the total weight of the epoxy resin composition.

3. The epoxy resin composition for encapsulating an optical semiconductor element according to 1. above, which further comprises the components (B) and (C):

(B) a curing agent and
(C) glass powder, wherein the relationship between an index of refraction (n1) of a cured product prepared by curing components other than a glass powder of component (C) in the epoxy resin composition for encapsulating an optical semiconductor element and an index of refraction (n2) of the component (C) satisfies the following formula (1):

$$-0.01 \leq (n2-n1) \leq 0.01$$

wherein
n1: index of refraction of a cured product prepared by curing components other than the component (C) at a wavelength of 589.3 nm
n2: index of refraction of the component (C) at a wavelength of 589.3 nm.

4. The epoxy resin composition for encapsulating an optical semiconductor element according to 3. above, wherein the total amount of the silicon dioxide particles (a) in the component (A) and glass powder as the component (C) is within the range of from 10 to 75% by weight based on the total weight of the epoxy resin composition.

5. An optical semiconductor device comprising the epoxy resin composition for encapsulating an optical semiconductor element described in any one of 1. to 4. above and an optical semiconductor element, wherein said optical semiconductor element is sealed with said epoxy resin composition.

Thus, the present invention is an epoxy resin composition for encapsulating an optical semiconductor element which comprises an epoxy resin complex (component (A)) wherein the aforementioned epoxy resin is used as the matrix component and specified silicon dioxide particles (a) are dispersed therein. Accordingly, coefficient of linear expansion of a cured product becomes small by the formulation of silicon dioxide particles so that reduction of internal stress can be made and deterioration of optical semiconductor elements can be effectively prevented. What is more, since an epoxy resin complex (component (A)) in which the aforementioned specified silicon dioxide particles (a) are dispersed is used, excellent light transmittance can be obtained within a broad temperature range, and the conventional light transmittance reducing phenomenon which is caused by the temperature-dependency and is possessed by a transparent inorganic filler system cannot be found. Accordingly, the optical semiconductor device in which an optical semiconductor element is sealed with the epoxy resin composition for encapsulating an optical semiconductor element of the present invention is excellent in reliability and transparency, shows less fluctuation of light transmittance at each temperature and can fully exert its function.

In addition, when containing ratio of silicon dioxide particles in the epoxy resin complex (A) in which the aforementioned specified silicon dioxide particles are dispersed is set to a range of from 5 to 50% by weight based on the entire epoxy resin composition, periodical change in the viscosity increase is controlled and desired mechanical properties are obtained.

In addition, the present invention is an epoxy resin composition for encapsulating an optical semiconductor element comprising an epoxy resin complex (component (A)) in which the aforementioned epoxy resin is used as the matrix component and specified silicon dioxide particles (a) are dispersed therein, a curing agent (component (B)) and a glass powder (component (C)), wherein relationship between an index of refraction (n1) of a cured product prepared by curing components other than the aforementioned component (C) and an index of refraction (n2) of the component (C) satisfies the aforementioned formula (1). Accordingly, coefficient of linear expansion of a cured product becomes small by the formulation of the aforementioned glass powder (component (C)) so that reduction of internal stress can be effected and deterioration of optical semiconductor elements can be effectively prevented. What is more, since the aforementioned epoxy resin complex (component (A)) in which the specified silicon dioxide particles (a) are dispersed is used, and the aforementioned difference between respective indexes of refraction has a specified range, excellent light transmittance can be obtained. Accordingly, the optical semiconductor device in which an optical semiconductor element is sealed with the epoxy resin composition for encapsulating an optical semiconductor element of the present invention is excellent in reliability and transparency and can fully exert its function.

BRIEF DESCRIPTION OF THE DRAWINGS

The FIGURE shows a sectional view of an example of an LED package (an optical semiconductor device).

DETAILED DESCRIPTION OF THE INVENTION

The epoxy resin composition for encapsulating an optical semiconductor element of the present invention is obtained using an epoxy resin complex (component (A)) in which specified silicon dioxide particles are dispersed.

Also, the epoxy resin composition for encapsulating an optical semiconductor element of the present invention is obtained by using the aforementioned epoxy resin complex (component (A)) generally together with using a curing agent (component (B)). In addition, a glass powder (component (C)) having an index of refraction similar to the index of refraction of a cured product can also be used.

In the aforementioned specified epoxy resin complex (component (A)), an epoxy resin is used as the matrix component and specified silicon dioxide particles (a) having an average particle size of from 5 to 40 nm measured by the small angle neutron scattering (SANS) are dispersed therein.

Such an epoxy resin complex (component (A)) is prepared, for example, in the following manner. Firstly, a commercially available alkali silicate aqueous solution having a water content of 47% and a ratio of $SiO_2$ to $Na_2O$ of 2.4 is diluted with desalted water to a predetermined water content. Using this diluted solution, the silicate is subjected to condensation polymerization until the average particle size reaches a range of from 5 to 40 nm. That is, 100 parts by weight (to be referred to as "part(s)" hereinafter) of the aforementioned diluted solution is passed through a column packed with a commercially available acidic ion exchanger (alkali ion is exchanged with $H^+$ ion, thereby exerting an action to start condensation polymerization) at a rate of from 15 to 43 parts per 1 hour, and then this is fed into distillation apparatus where the supplied deionized silicate solution is kept at boiling temperature and the evaporated water is removed from the solution. After completion of the feeding, the thus formed silicic acid sol is concentrated by further heating it, and its pH is adjusted to an alkaline value of from 10.5 to 11.0. By adjusting to the alkaline value, the thus formed silicon dioxide particles are stabilized against further condensation polymerization or aggregation.

Next, from 5 to 7 parts of a silane coupling agent is added to 100 parts of the thus prepared silicic acid sol and mixed with stirring. Isopropanol is added to this mixture, and water is removed to a content of less than 0.1% by weight by ordinary pressure distillation while measuring it by the Karl Fischer's method. Isopropanol solution of an epoxy resin is added to this. Subsequently, an epoxy resin complex (component (A)) of a transparent dispersion system in which silicon dioxide particles having a specified range of average particle size are dispersed is obtained by removing volatile components by distillation.

According to the thus obtained epoxy resin complex (component (A)), silicon dioxide particles are dispersed in the matrix component epoxy resin, and average particle size of the aforementioned silicon dioxide particles measured by the small angle neutron scattering (SANS) is from 5 to 40 nm. The average particle size is more preferably within the range of from 5 to 30 nm, particularly preferably within the range of from 10 to 25 nm. That is, this is because stability as the particle dispersion system (periodical increase of viscosity) becomes a problem when the average particle size exceeds 40 nm, and the dispersion resin system itself becomes highly viscous so that a predetermined fluidity cannot be obtained when it is less than 5 nm. In this connection, the aforementioned measuring method by the small angle neutron scattering (SANS) is a magnetic structure- or deuteration-aided measuring method which measures a nano-scale substance that cannot easily be measured by electron microscope or small angle X-ray scattering.

Examples of the silane coupling agent to be added to the aforementioned silicic acid sol include γ-aminopropyltrimethoxysilane, γ-aminopropylmethyldiethoxysilane, γ-aminopropyldimethylmethoxysilane, glycidyloxypropyltrimethoxysilane, glycidyloxypropyldimethylmethoxysilane, methacryloxypropyltrimethoxysilane, chloropropyltrimethoxysilane, vinylmethyldimethoxysilane, vinyltrispropeneoxysilane, vinyldimethylbutanoneoximesilane, vinyltrisbutanoneoximesilane, trimethylchlorosilane, vinyldimethylchlorosilane, dimethylchlorosilane, vinylmethylchlorosilane and the like. These may be used alone or as a mixture of two or more.

The aforementioned epoxy resin is not particularly limited, and its examples include various conventional epoxy resins such as a bisphenol A type epoxy resin, a bisphenol F type epoxy resin, a novolak type epoxy resin, an alicyclic epoxy resin, a hydrogenated bisphenol A type epoxy resin, an aliphatic epoxy resin, a glycidyl ether type epoxy resin, a bisphenol S type epoxy resin and the like. These can be used alone or as a mixture of two or more. Among these epoxy resins, it is desirable to use a bisphenol A type epoxy resin, a bisphenol F type epoxy resin, a novolak type epoxy resin, or an alicyclic epoxy resin from the viewpoint of excellent transparency and discoloration resistance.

Amount of the silicon dioxide particles (a) dispersed in the thus obtained epoxy resin complex (component (A)) is within the range of preferably from 5 to 50% by weight, more preferably from 10 to 40% by weight, based on the entire epoxy resin composition. That is, it is difficult to obtain desired mechanical properties when less than 5% by weight, and exceeding 50% by weight shows a tendency of considerably increasing periodical change of viscosity increase of the silicon dioxide particle-dispersed system resin.

In addition, according to the epoxy resin composition for encapsulating an optical semiconductor element of the present invention, a single epoxy resin may be used together with the epoxy resin complex (component (A)) prepared by dispersing the aforementioned specified silicon dioxide particles (a).

Examples of the aforementioned epoxy resin include a bisphenol A type epoxy resin, a bisphenol F type epoxy resin, a phenol novolak type epoxy resin, a cresol novolak type epoxy resin and the like novolak type epoxy resins, an alicyclic epoxy resin, a triglycidyl isocyanurate, a hydantoin epoxy resin and the like nitrogen-containing epoxy resins, a hydrogenated bisphenol A type epoxy resin, an aliphatic epoxy resin, a glycidyl ether type epoxy resin, a bisphenol S type epoxy resin, a biphenyl epoxy resin as the main stream of low water absorption cured product type, a bicyclic ring type epoxy resin, a naphthalene type epoxy resin and the like. These can be used alone or as a mixture of two or more. Among these epoxy resins, it is desirable to use a bisphenol A type epoxy resin, a bisphenol F type epoxy resin, a novolak type epoxy resin, an alicyclic epoxy resin or a triglycidyl isocyanurate from the viewpoint of excellent transparency and discoloration resistance.

As the aforementioned epoxy resin, it may be either solid or liquid at ordinary temperature, but in general, it is desirable that average epoxy equivalent of the epoxy resin to be used is from 90 to 1,000, and in the case of a solid, its softening point is preferably 160° C. or less. That is, when the epoxy equivalent is smaller than 90, cured product of the epoxy resin composition for encapsulating an optical semiconductor element may become brittle in some cases. Also, when the epoxy equivalent exceeds 1,000, glass transition temperature (Tg) of the cured product sometimes may become low. In this connection, according to the present invention, the aforementioned ordinary temperature is within the range of from 5 to 35° C.

In this connection, when an epoxy resin is used jointly with the aforementioned epoxy resin complex (component (A)), it is desirable to set their joint use ratio in accordance with the formulation ratio of the epoxy resin complex (component (A)) with a curing agent (component (B)), which is described later, so that the entire epoxy resin component and the curing agent (component (B)) become the formulation ratio which is described later.

As the aforementioned curing agent (component (B)), an acid anhydride system curing agent and a phenol system curing agent can be exemplified. Examples of the aforementioned acid anhydride system curing agent include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride and the like. These can be used alone or as a mixture of two or more. Among these acid anhydride system curing agent, it is desirable to use phthalic anhydride, hexahydrophthalic anhydride, tetrahydrophthalic anhydride or methylhexahydrophthalic anhydride. As the aforementioned acid anhydride system curing agent, it is desirable that its molecular weight is approximately from 140 to 200, and a colorless to pale yellow acid anhydride is desirable.

On the other hand, examples of the aforementioned phenol system curing agent include a phenol novolak resin system curing agent and the like.

Regarding the formulation ratio of the aforementioned epoxy resin complex (component (A)) and curing agent (component (B)), it is desirable to set it to such a ratio that the active group (acid anhydride group or hydroxyl group) capable of reacting with epoxy group in the curing agent (component (B)) becomes from 0.5 to 1.5 equivalent, more desirably from 0.7 to 1.2 equivalents, based on 1 equivalent of epoxy group in the aforementioned epoxy resin complex (component (A)). That is, in case that the active group is less than 0.5 equivalent, curing rate of the epoxy resin composition for encapsulating an optical semiconductor element becomes slow and its cured product shows a tendency of lowering glass transition temperature, and when it exceeds 1.5 equivalent, there is a tendency to reduce moisture resistance.

Regarding the aforementioned curing agent (component (B)), in addition to the aforementioned acid anhydride system curing agent and phenol system curing agent, conventional epoxy resin curing agents, such as an amine system curing agent, the aforementioned acid anhydride system curing agent partially esterified with an alcohol or a curing agent of hexahydrophthalic acid, tetrahydrophthalic acid, methylhexahydrophthalic acid or the like polyvalent carboxylic acid, may be used alone or jointly with the acid anhydride system curing agent and phenol system curing agent, depending on its purpose and use. For example, when a polyvalent carboxylic acid curing agent is jointly used, it quickly reacts with the epoxy resin, so that a B stage-like (semi-cured state) resin composition having necessary viscosity can be obtained without causing gelation, and productivity of the composition can be improved. In this connection, even in case that these curing agents are used, the blending ratio may be the same as the blending ratio (equivalent ratio) of the case of the use of the acid anhydride system curing agent and phenol system curing agent.

As the glass powder (component (C)) to be used together with the aforementioned component (A) and component (B), $SiO_2$ alone or a preparation containing $SiO_2$ and $B_2O_3$ as the main components can be exemplified. Also, as the aforementioned glass powder, it is desirable that at least one component selected from the group consisting of zinc, titanium, cerium, bismuth, lead and selenium is optionally formulated together with the aforementioned main components. For example, in case that zinc is formulated, it is generally formulated as ZnO, and it is desirable to set its containing ratio to from 1 to 10% by weight based on the entire glass powder. In addition, in case that titanium is formulated, it is generally formulated as $TiO_2$, and it is desirable to set its containing ratio to from 1 to 10% by weight based on the entire glass powder.

On the other hand, for the purpose of adjusting index of refraction of the aforementioned glass powder (component (C)), it is desirable that $Na_2O$, $Al_2O_3$, CaO, BaO or the like is optionally formulated as occasion demands.

In addition, the aforementioned glass powder (component (C)) can be obtained by pulverizing a glass frit prepared by melting and rapidly cooling the aforementioned respective materials, using ball mill or the like. When air bubbles are present in the aforementioned glass frit, light transmittance is reduced by the reflection of light at the air bubble interface, so that it is necessary to make a sufficiently degassed state by increasing the melting temperature. In addition, since there is a case in which the glass powder surface is stained by metal parts of a pulverizer or the like in carrying out the aforementioned pulverization, it is desirable to use a metal or ceramic thermal spraying metal having high abrasion resistance in the parts of the pulverizer. The thus obtained pulverized state glass powder may be used as such, but it is desirable to use it, for example, as a spherical glass powder prepared by spheroidizing the surface through a flame treatment. Since the aforementioned spherical glass powder does not have bubbles, cracks and the like on the surface, light scattering is small at the interface of the resin component and glass powder, so that it becomes possible to improve light transmittance of the resulting cured product. In addition, in carrying out the aforementioned flame treatment, incomplete combustion is avoided to prevent adhesion of carbide to the surface. Also, in order to avoid aggregation of particles of the glass powder and resulting formation of a snowman-like shape, it is desirable to adjust the glass powder to be subjected to the flame treatment such that its amount becomes not too large. In addition, when particle size of the glass powder before the flame treatment is made uniform using a screen or the like, particle size of the obtained spherical glass powder is also apt to become uniform, so that a product having high sphericity is obtained.

It is desirable that the glass powder obtained in this manner has a predetermined particle size effected, for example, by the use of a screen or the like, and when viscosity of the resin component at the time of the glass powder mixing and gate clogging or the like formability at the time of forming are taken into consideration, it is desirable that the glass powder (component (C)) has an average particle size of from 5 to 100 μm.

The amount of the glass powder (component (C)) is set to preferably 60% by weight or less, particularly preferably 50% by weight or less, based on the entire epoxy resin component. In this case, lower limit of the containing amount of the glass powder (component (C)) is generally 5% by weight. That is, this is because the ratio of scattering at the interface becomes high, thus showing a tendency of generating reduction of the transmittance, when the amount exceeds 60% by weight.

In addition, it is desirable that the total amount of the aforementioned silicon dioxide particles (a) in the epoxy resin complex (component (A)) and the aforementioned glass powder (component (C)) is set to a range of from 10 to 75% by weight, particularly desirably from 10 to 60% by weight, based on the entire epoxy resin composition. That is, it may be difficult to expect sufficient reduction of coefficient of linear expansion when it is less than 10% by weight, and a tendency of causing a difficulty in obtaining a good formed product is found when it exceeds 75% by weight due to too high melt viscosity of the resin composition.

According to the epoxy resin composition for encapsulating an optical semiconductor element of the present invention, it is necessary that relationship between an index of refraction (n1) of a cured product prepared by curing components other than the aforementioned glass powder (component (C)) and an index of refraction (n2) of the aforementioned glass powder (component (C)) satisfies the following formula (1). That is, improvement of the light transmittance at respective wavelengths can be effected when the relationship between indexes of refraction of both cases satisfies the aforementioned relationship.

$$-0.01 \leq (n2-n1) \leq 0.01$$

In the above formula (1), n1: index of refraction of a cured product prepared by curing components other than the component (C) at a wavelength of 589.3 nm, and n2: index of refraction of the component (C) at a wavelength of 589.3 nm.

Further, it is particularly desirable that relationship between the index of refraction (n1) of a cured product prepared by curing components other than the aforementioned glass powder (component (C)) and the index of refraction (n2) of the aforementioned glass powder (component (C)) satisfies the following formula (2).

$$-0.006 \leq (n2-n1) \leq 0.006$$

In the above formula (2), n1: index of refraction of a cured product prepared by curing components other than the component (C) at a wavelength of 589.3 nm, and n2: index of refraction of component (C) at a wavelength of 589.3 nm.

In this connection, the aforementioned respective indexes of refraction can be measured by an immersion method. That is, particles are dispersed in respective solutions having different index of refraction, and using a dispersion showing the most high transmittance of light having a wavelength of 589.3 nm, index of refraction of the dispersion against sodium D light is measured using Abbe's refractometer at 25° C.

Thus, examples of the method for obtaining the aforementioned relationship between indexes of refraction of the aforementioned cured product of the resin component and the aforementioned glass powder (component (C)) include a method for adjusting index of refraction of the cured product of resin component (e.g., selection of the kind of epoxy resin, joint use of two or more epoxy resins, selection of the kind of curing agent, joint use of two or more curing agent, or the like), a method for adjusting index of refraction of the glass powder (component (C)) (e.g., selection of material composition, adjustment of formulation ratio, or the like), and a method in which these two methods are jointly used. In general, difference between the indexes of refraction of the cured product of the resin component and the glass powder (component (C)) is adjusted to a further small value by approximating index of refraction of the glass powder (component (C)) to that of the cured product of the resin component to a certain degree, and then further adjusting index of refraction of the cured product of the resin component.

More illustratively, for example, in case that the epoxy resin is triglycidyl isocyanurate and the curing agent is an acid anhydride system curing agent, as exemplified in the foregoing as a preferred combination of epoxy resin and curing agent regarding the resin components, it is desirable that the glass powder composition is determined as $SiO_2$—$B_2O_3$—$ZnO$—$Al_2O_3$—$CaO$—$Sb_2O_3$, and respective components in the composition are formulated such that $SiO_2$ becomes from 45 to 55% by weight, and $B_2O_3$ from 10 to 25% by weight, ZnO from 1 to 6% by weight, $Al_2O_3$ from 10 to 18% by weight, CaO from 7 to 20% by weight and $Sb_2O_3$ from 0.1 to 5% by weight.

Also, in case that the epoxy resin is a bisphenol A type epoxy resin and a novolak type epoxy resin and the curing agent is a phenol system curing agent, it is desirable that the glass powder composition is determined as $SiO_2$—$B_2O_3$—$TiO_2$—$Al_2O_3$—$CaO$—$BaO$ or $SiO_2$—$TiO_2$—$Al_2O_3$—$CaO$—$BaO$, and respective components in the composition are formulated such that $SiO_2$ becomes from 40 to 55% by weight, and $B_2O_3$ from 0 to 2% by weight, $TiO_2$ from 1 to 7% by weight, $Al_2O_3$ from 12 to 17% by weight, CaO from 25 to 35% by weight and BaO from 5 to 10% by weight.

In addition, in order to control reduction of light transmittance to the minimum, it is desirable to set the aforementioned specified silicon dioxide particles to the maximum filling amount, and it is desirable to obtain the whole inorganic fillers (silicon dioxide particles and glass powder) by making up for the shortage using the aforementioned glass powder (component (C)). However, even in the case of the inorganic filler content realizable by the use of the aforementioned silicon dioxide particles alone within such a range that the light transmittance is not spoiled, it is possible to make a desired inorganic filler by jointly using the glass powder (component (C)) for increasing the degree of freedom for formulation designing.

Also, in addition to the aforementioned epoxy resin complex (component (A)) prepared by dispersing specified silicon dioxide particles, a curing agent (component (B)) and a glass powder (component (C)) to be further used in some cases, and an epoxy resin to be further used in some cases, various conventionally used known additives, such as a hardening accelerator, a deterioration preventing agent, a denaturant, a silane coupling agent, a defoaming agent, a leveling agent, a releasing agent, a dyestuff, a pigment and the like, may be optionally formulated as occasion demands in the epoxy resin composition for encapsulating an optical semiconductor element of the present invention.

The hardening accelerator is not particularly limited, and its examples include 1,8-diaza-bicyclo(5,4,0)undecene-7, triethylenediamine, tri-2,4,6-dimethylaminomethylphenol and the like tertiary amines, 2-ethyl-4-methylimidazole, 2-methylimidazole and the like imidazoles, triphenylphosphine, tetraphenylphosphonium tetraphenylborate, tetra-n-butylphosphonium-o,o-diethylphosphoro dithioate and the like phosphorus compounds, quaternary ammonium salts, organic metal salts and derivatives thereof. These can be used alone or as a mixture of two or more. Among these hardening accelerators, it is desirable to use tertiary amines, imidazoles or phosphorus compounds.

Containing amount of the aforementioned hardening accelerator is preferably from 0.01 to 8.0 parts, more preferably from 0.1 to 3.0 parts, based on 100 parts of the aforementioned epoxy resin complex (component (A)). That is, this is because sufficient hardening accelerating effect may hardly be obtained when it is less than 0.01 part, and discoloration is sometimes found on the obtained cured product when it exceeds 8.0 parts.

As the aforementioned deterioration preventing agent, a phenol system compound, an amine system compound, an organic sulfur system compound, a phosphine system compound and the like conventional deterioration preventing agents can for example be cited. As the aforementioned denaturant, glycols, silicones, alcohols and the like conventional denaturants can for example be cited. As the aforementioned silane coupling agent, a silane system, a titanate system and the like conventional silane coupling agents can for example be cited. In addition, examples of the aforementioned defoaming agent include a silicone system and the like conventional defoaming agents.

In addition, the epoxy resin composition for encapsulating an optical semiconductor element of the present invention can be obtained in the form of a liquid, a powder or a tablet made from the powder, by producing it in the following manner. That is, in order to obtain a liquid epoxy resin composition for encapsulating an optical semiconductor element, for example, the aforementioned respective components, namely the aforementioned component (A) and other components which are formulated as occasion demands, are optionally formulated. In addition, when it is obtained in the form of a powder or a tablet made from the powder, for example, the aforementioned respective components are optionally formulated to carry out preliminary mixing and kneaded using a kneader to carry out melt mixing, and then this is cooled down to room temperature and pulverized by a conventional means, if necessary further carrying out tablet making.

The epoxy resin composition for encapsulating an optical semiconductor element of the present invention obtained in this manner is used for the encapsulation of LED, charge coupled device (CCD) and the like optical semiconductor elements. That is, encapsulation of an optical semiconductor element using the epoxy resin composition for encapsulating an optical semiconductor element of the present invention can be carried out by a transfer molding, cast molding or the like conventional molding method without particular limitation. In this connection, when the epoxy resin composition for encapsulating an optical semiconductor element of the present invention is in a liquid state, it may be used as a so-called two-component type in which at least the epoxy resin component and curing agent are separately stored and then mixed just before use. In addition, when the epoxy resin composition for encapsulating an optical semiconductor element of the present invention is in the form of a powder or tablet, it may be made into a B-stage (semi-cured state) at the time of carrying out melt-mixing of the aforementioned respective components, and this is heat-melted when used.

In addition, when an optical semiconductor element is sealed with the epoxy resin composition for encapsulating an optical semiconductor element of the present invention, deterioration of the optical semiconductor element can be prevented because of the small internal stress and good light transmittance can also be obtained over the whole wavelengths. Thus, the optical semiconductor device of the present invention prepared by encapsulating an optical semiconductor element with the epoxy resin composition for encapsulating an optical semiconductor element of the present invention is excellent in reliability and transparency and has less change of light transmittance over respective wavelengths, so that it can fully exert its functions.

The FIGURE shows a sectional view of an example of an LED package (an optical semiconductor device). The optical semiconductor device (1) comprises an optical semiconductor element (a), a wire (b), and a lead (e). The optical semiconductor element (1) is sealed with a cured epoxy resin composition (c) comprising an epoxy resin as the matrix component and silicon dioxide particles (d) dispersed therein.

Next, Examples are described together with Comparative Examples.

Prior to carrying out the examples, respective components shown below were prepared.

Epoxy Resin a:
  Bisphenol A type epoxy resin (epoxy equivalent 185)

Epoxy Resin b:
  Bisphenol A type epoxy resin (epoxy equivalent 650)

Epoxy Resin c:
  Triglycidyl isocyanurate (epoxy equivalent 100)

Acid Anhydride Curing Agent:
  A mixture of 4-methylhexahydrophthalic anhydride (x) and hexahydrophthalic anhydride (y) (mixing weight ratio x:y=7:3) (acid anhydride equivalent 164)

Silicon Dioxide Particle-dispersed Epoxy Resin a-1:
  NANOPOX XP 22/0504 manufactured by Hanze-Chemi (bisphenol A type epoxy resin (epoxy equivalent 190), solid content 50% by weight, average particle size of silicon dioxide particles 15 nm)

Silicon Dioxide Particle-dispersed Epoxy Resin b:
  NANOPOX XP 22/0316 manufactured by Hanze-Chemi (alicyclic epoxy resin (epoxy equivalent 150), solid content 50% by weight, average particle size of silicon dioxide particles 15 nm)

Silicon Dioxide Particle-dispersed Epoxy Resin c:
  NANOPOX XP 22/0540 manufactured by Hanze-Chemi (bisphenol F type epoxy resin (epoxy equivalent 212), solid content 60% by weight, average particle size of silicon dioxide particles 15 nm).

Silicon Dioxide Particle-dispersed Epoxy Resin a-2:
  NANOPOX XP 22/0543 manufactured by Hanze-Chemi (bisphenol A type epoxy resin (epoxy equivalent 190), solid content 50% by weight, average particle size of silicon dioxide particles 15 nm).

Spherical Glass Powder a:
  A spherical glass powder which is obtained by flame treatment and has a CaO composition ($SiO_2$: 57.0% by weight, $B_2O_3$: 3.0% by weight, SrO: 6.5% by weight, $Al_2O_3$: 15.0% by weight, CaO: 18.0% by weight, average particle size 35 µm having a particle size distribution with a maximum particle size of 75 µm, index of refraction: 1.56).

Spherical Glass Powder b:
  A spherical glass powder which is obtained by flame treatment and has a CaO composition ($SiO_2$: 51.0% by weight, $B_2O_3$: 20.5% by weight, ZnO: 2.9% by weight, $Al_2O_3$: 15.1% by weight, CaO: 9.9% by weight, $Sb_2O_3$: 0.5% by weight, average particle size 35 µm having a particle size distribution with a maximum particle size of 75 µm, index of refraction: 1.53).

Coupling Agent:
  A mercapto-containing silane coupling agent (KBM-803 mfd. by Shin-Etsu Chemical)

Curing Catalyst:
  2-Ethyl-4-methylimidazole

Antioxidant-1:
  9,10-Dihydro-9-oxa-10-phosphaphenanthrene-10-oxide

Antioxidant-2:
  t-Butylhydroxytoluene

EXAMPLES 1 TO 5 AND COMPARATIVE EXAMPLES 1 TO 3

Respective components shown in the following Table 1 and Table 2 were formulated at respective ratios shown in the same tables, melt-mixed at 110° C., solidified by cooling and then pulverized and made into tablets, thereby preparing the epoxy resin compositions of interest.

TABLE 1

| | | Examples (parts) | | | | |
|---|---|---|---|---|---|---|
| | | 1 | 2 | 3 | 4 | 5 |
| Epoxy resin | a | — | — | 75 | — | — |
| | b | — | — | — | — | — |
| | c | — | — | — | — | — |
| Acid anhydride system curing agent | | 100 | 115 | 100 | 100 | 140 |
| Silicon dioxide particle-dispersed epoxy resin | a-1 | 200 | — | 50 | 400 | — |
| | b | — | 200 | — | — | — |
| | c | — | — | — | — | 400 |
| Spherical glass powder a | | — | — | — | — | — |
| Curing catalyst | | 1 | 1 | 1 | 1.5 | 1 |
| Antioxidant-1 | | 1 | 1 | 1 | 1.5 | 1 |
| Coupling agent | | 1 | 1 | 1 | 1.5 | 1 |
| The silicon dioxide particle content in the entire epoxy resin composition (% by weight) | | 33.0 | 31.5 | 11.0 | 39.6 | 44.4 |

TABLE 2

| | | Comparative Examples (parts) | | |
|---|---|---|---|---|
| | | 1 | 2 | 3 |
| Epoxy resin | a | 100 | 100 | — |
| | b | — | — | 80 |
| | c | — | — | 20 |
| Acid anhydride system curing agent | | 100 | 100 | 50 |
| Spherical composite inorganic oxide particle powder | a-1 | — | — | — |
| | b | — | — | — |
| | c | — | — | — |
| Spherical glass powder a-1 | | — | 75 | 75 |
| Curing catalyst | | 1 | 1 | 1 |
| Antioxidant-1 | | 1 | 1 | 1 |
| Coupling agent | | 1 | 1 | 1 |

Using the thus obtained respective epoxy resin compositions, light transmittance at varied temperatures (25° C., 60° C. and 100° C.) and coefficient of linear expansion of cured products were measured and evaluated in accordance with the following methods. In addition, using the thus obtained respective epoxy resin compositions, optical semiconductor devices were prepared in accordance with the following method and their wire fraction defective values were measured. These results are shown in the following Table 3 and Table 4.

Light Transmittance:

Using respective epoxy resin compositions, cured products of 1 mm in thickness were prepared (curing condition: 150° C.×2 hours). Thereafter, using each of the aforementioned cured products, light transmittance at a wavelength of 589.3 nm was measured under respective temperature conditions of 25° C., 60° C. and 100° C. using a spectrophotometer UV 3101 manufactured by Shimadzu Corp.

Coefficient of Linear Expansion:

Using respective epoxy resin compositions, cured products of 1 mm in thickness were prepared (curing condition: 150° C.×2 hours). Thereafter, using each of the aforementioned cured products, coefficient of linear expansion ($\alpha 1$) at a temperature lower than the glass transition temperature was measured at a programming rate of 2° C./min using a thermal analyzer (TMA-50, manufactured by Shimadzu Corp).

Wire Fraction Defective:

Using each of the respective epoxy resin compositions, a GaP system LED was sealed as a shell type lamp of 5 mm in diameter by potting (150° C.×2 hours) and further cured at 150° C. for 3 hours to prepare an optical semiconductor device. Thereafter, the wire fraction defective (%) was measured after 200 thermal cycles, one cycle being −25° C.×30 min/125° C.×30 min. In this case, the number of samples (n) of each optical semiconductor device was fixed to 24.

TABLE 3

| | | Examples | | | | |
|---|---|---|---|---|---|---|
| | | 1 | 2 | 3 | 4 | 5 |
| Wire fraction defective (%) | | 25.0 | 29.2 | 41.7 | 16.7 | 28.0 |
| Light transmittance (%) | 25° C. | 92.7 | 94.0 | 94.8 | 91.3 | 92.5 |
| | 60° C. | 92.2 | 93.5 | 94.2 | 92.0 | 92.2 |
| | 100° C. | 92.4 | 93.4 | 93.9 | 92.1 | 91.9 |
| Coefficient of linear expansion $\alpha 1$ (ppm) | | 45 | 46 | 56 | 47 | 47 |

TABLE 4

| | | Comparative Examples | | |
|---|---|---|---|---|
| | | 1 | 2 | 3 |
| Wire fraction defective (%) | | 66.7 | Generation of sedimentation* | 25.0 |
| Light transmittance (%) | 25° C. | 95.7 | | 37.2 |
| | 60° C. | 95.2 | | 22.9 |
| | 100° C. | 95.4 | | 15.9 |
| Coefficient of linear expansion $\alpha 1$ (ppm) | | 65 | | 44 |

*Light transmittance was unable to measure due to the generation of aggregation sedimentation of the spherical glass powder, and regarding the wire fraction defective and coefficient of linear expansion, accurate wire damage was unable to measure due to two layer separation at the time of preparing the lamp.

It can be understood from the aforementioned results that the internal stress was reduced in the products of Examples, because their wire fraction defective was small and coefficient of linear expansion was also small. What is more, optical semiconductor devices having high light transmittance, excellent temperature dependency and excellent reliability were obtained.

Contrary to this, the product of Comparative Example 1 has high light transmittance at 25, 60 and 100° C. as a matter of course because of the formulation of the filling material for reducing internal stress, but its reliability is poor because of the considerably high wire fraction defective and high coefficient of linear expansion. Also, the product of Comparative Example 2 generated aggregation sedimentation of the powder because of the use of spherical glass powder. In addition, though the spherical glass powder was also used in the product of Comparative Example 3, wire fraction defective was low, but the light transmittance was low under respective temperature conditions.

EXAMPLES 6 TO 11 AND COMPARATIVE EXAMPLES 4 TO 7

Respective components shown in the following Table 3 and Table 4 were formulated at respective ratios shown in the same tables, melt-mixed at from 80 to 110° C., solidified by cooling and then pulverized and made into tablets, thereby preparing the epoxy resin compositions of interest.

TABLE 5

| | | Examples (parts) | | | | | |
|---|---|---|---|---|---|---|---|
| | | 6 | 7 | 8 | 9 | 10 | 11 |
| Epoxy resin | a | — | — | — | 50 | — | — |
| | c | — | — | — | — | — | 20 |
| Acid anhydride system curing agent | | 90 | 90 | 90 | 110 | 95 | 105 |
| Silicon dioxide particle-dispersed epoxy resin | a-2 | 200 | 200 | 200 | 150 | — | 160 |
| | b | — | — | — | — | 200 | — |
| Spherical glass powder | a | 200 | 300 | 470 | 60 | 200 | 80 |
| | b | — | — | — | — | — | — |
| Hardening accelerator | | 1 | 1 | 1 | 1 | 1 | 1 |
| Coupling agent | | 1 | 1 | 1 | 1 | 1 | 1 |
| Antioxidant-2 | | 1 | 1 | 1 | 1 | 1 | 1 |
| The silicon dioxide particle and glass powder content in the entire portion (% by weight) | | 60.9 | 67.5 | 74.7 | 39.4 | 60.2 | 43.4 |
| The silicon dioxide particle content in the entire portion (% by weight) | | 20.3 | 16.9 | 13.1 | 19.1 | 20.1 | 21.7 |
| The glass powder content in the entire portion (% by weight) | | 40.6 | 50.6 | 61.6 | 20.4 | 40.2 | 21.7 |

TABLE 6

| | | Comparative Examples (parts) | | | |
|---|---|---|---|---|---|
| | | 4 | 5 | 6 | 7 |
| Epoxy resin | a | 100 | 100 | 80 | 20 |
| | c | — | — | 20 | 80 |
| Acid anhydride system curing agent | | 90 | 90 | 100 | 150 |
| Silicon dioxide particle-dispersed epoxy resin | a-2 | — | — | — | — |
| | b | — | — | — | — |
| Spherical glass powder | a | — | — | 310 | — |
| | b | — | 200 | — | 310 |
| Hardening accelerator | | 1 | 1 | 1 | 1 |
| Coupling agent | | 1 | 1 | 1 | 1 |
| Antioxidant-2 | | 1 | 1 | 1 | 1 |
| The silicon dioxide particle and glass powder content in the entire portion (% by weight) | | — | 50.9 | 60.4 | 55.1 |
| The silicon dioxide particle content in the entire portion (% by weight) | | — | — | — | — |
| The glass powder content in the entire portion (% by weight) | | — | 50.9 | 60.4 | 55.1 |

Using the thus obtained respective epoxy resin compositions, light transmittance and coefficient of linear expansion of cured products were measured and evaluated in accordance with the following methods. Also, difference between the index of refraction (n1) of a cured product prepared by curing components of each epoxy resin composition excluding the spherical glass powder and the index of refraction (n2) of the aforementioned spherical glass powder, namely (n2−n1), was measured and calculated in accordance with the aforementioned method. In this case, forming condition of the aforementioned cured product was set to 150° C.×2 hours. On the other hand, using the thus obtained respective epoxy resin compositions, optical semiconductor devices were prepared in accordance with the following method and their wire fraction defective values were measured, and their appearance was also evaluated. These results are shown in the following Table 7 and Table 8.

Light Transmittance:

Using respective epoxy resin compositions, cured products of 1 mm in thickness were prepared (curing condition: 150° C.×2 hours). Thereafter, using each of the aforementioned cured products, light transmittance at a wavelength of 589.3 nm was measured at room temperature (25° C.) using a spectrophotometer UV 3101 manufactured by Shimadzu Corp.

Coefficient of Linear Expansion:

Using respective epoxy resin compositions, cured products of 1 mm in thickness were prepared (curing condition: 150° C.×2 hours). Thereafter, using each of the aforementioned cured products, coefficient of linear expansion ($\alpha 1$) at a temperature lower than the glass transition temperature was measured at a programming rate of 2° C./min using a thermal analyzer (TMA-50, manufactured by Shimadzu Corp).

Wire Fraction Defective:

Using each of the respective epoxy resin compositions, a GaP system LED was sealed as a shell type lamp of 5 mm in diameter by potting (150° C.×2 hours) and further cured at 150° C. for 3 hours to prepare an optical semiconductor device. Thereafter, the wire fraction defective (%) was measured after 200 thermal cycles, one cycle being −25° C.×30 min/125° C.×30 min. In this case, the number of samples (n) of each optical semiconductor device was fixed to 24.

TABLE 7

| | Examples | | | | | |
|---|---|---|---|---|---|---|
| | 6 | 7 | 8 | 9 | 10 | 11 |
| Difference in index of refraction (n2 − n1) | 0.006 | 0.006 | 0.006 | 0.008 | 0.010 | 0.008 |
| Wire fraction defective (%) | 8.3 | 4.1 | 4.1 | 12.5 | 4.1 | 12.5 |
| Light transmittance (%) | 40 | 38 | 30 | 40 | 34 | 42 |
| Coefficient of linear expansion (ppm) | 38 | 32 | 25 | 47 | 34 | 46 |

TABLE 8

| | Comparative Examples | | | |
|---|---|---|---|---|
| | 4 | 5 | 6 | 7 |
| Difference in index of refraction (n2 − n1) | — | 0.020 | 0.003 | 0.003 |
| Wire fraction defective (%) | 75 | 12.5 | 12.5 | 12.5 |
| Light transmittance (%) | 96 | 10 | 20 | 17 |
| Coefficient of linear expansion (ppm) | 67 | 42 | 39 | 39 |
| Appearance | ○ | ○ | ○ | ○ |

It is evident from the above results that the internal stress was reduced in the products of Examples, because their wire fraction defective was small and coefficient of linear expansion was also small. What is more, optical semiconductor devices having high light transmittance and excellent reliability were obtained.

Contrary to this, the product of Comparative Example 4 has high light transmittance as a matter of course because silicon dioxide particles and glass powder are not formulated, but its reliability is poor because of the considerably high wire fraction defective and high coefficient of linear expansion. Also, the product of Comparative Example 5 showed extremely low light transmittance, because glass powder alone was used without formulating silicon dioxide particles and its difference in index of refraction (n2−n1) therefore was 0.020 overstepping the aforementioned specified range. The products of Comparative Examples 6 and 7 showed low light transmittance due to the use of glass powder alone without using silicon dioxide particles.

While the invention has been describe in detail and with reference to specific embodiments thereof, it will be apparent to one skilled in the art that various changes and modifications can be made therein without departing from the scope thereof.

This application is based on Japanese patent applications No. 2003-356788 filed Oct. 16, 2003 and No. 2004-118243 filed Apr. 13, 2004, the entire contents thereof being thereby incorporated by reference.

What is claimed is:

1. An epoxy resin composition for encapsulating an optical semiconductor element, comprising:
   (A) an epoxy resin complex which comprises an epoxy resin as the matrix component and silicon dioxide particles (a) dispersed therein:
   said silicon dioxide particles (a) having an average particle size of from 5 to 40 nm measured by the small angle neutron scattering (SANS)
   (B) a curing agent, and
   (C) glass powder,
   wherein the relationship between an index of refraction (n1) of a cured product prepared by curing components other than a glass powder of component (C) in the epoxy resin composition for encapsulating an optical semiconductor element and an index of refraction (n2) of the component (C) satisfies the following formula (1):

$$-0.01 \leq (n2-n1) \leq 0.01$$

wherein
   n1: index of refraction of a cured product prepared by curing components other than the component (C) at a wavelength of 589.3 nm
   n2: index of refraction of the component (C) at a wavelength of 589.3 nm.

2. The epoxy resin composition for encapsulating an optical semiconductor element according to claim 1, wherein containing ratio of the silicon dioxide particles (a) in the component (A) is within the range of from 5 to 50% by weight based on the total weight of the epoxy resin composition.

3. The epoxy resin composition for encapsulating an optical semiconductor element according to claim 1, wherein the total amount of the silicon dioxide particles (a) in the component (A) and glass powder as the component (C) is within the range of from 10 to 75% by weight based on the total weight of the epoxy resin composition.

4. An optical semiconductor device comprising the epoxy resin composition for encapsulating an optical semiconductor element described in any one of the claims 2 to 3 and an optical semiconductor element, wherein said optical semiconductor element is sealed with said epoxy resin composition.

5. The epoxy resin for encapsulating an optical semiconductor element according to claim 1, wherein the glass powder component (C) has an average particle size of from 5 to 100 μm.

6. The epoxy resin composition for encapsulating an optical semiconductor element according to claim 1, wherein the glass powder component (C) comprises $SiO_2$ alone or a preparation comprising $SiO_2$ and $B_2O_3$ as the main components and optionally at least one component selected from the group consisting of zinc, titianium, cerium, bismuth, lead and selenium formulated with the main components.

7. The epoxy resin composition for encapsulating an optical semiconductor element according to claim 1, wherein the glass powder component (C) is spherical glass powder.

8. The epoxy resin composition for encapsulating an optical semiconductor element according to claim 7, wherein the index of refraction is 1.56 or lower.

9. The epoxy resin composition for encapsulating an optical semiconductor element according to claim 7, wherein the index of refraction is 1.53 to 1.56.

* * * * *